United States Patent [19]

Wu et al.

[11] Patent Number: 5,411,903
[45] Date of Patent: May 2, 1995

[54] SELF-ALIGNED COMPLEMENTARY HFETS

[75] Inventors: Schyi-yi Wu, Mesa; Jenn-Hwa Huang, Gilbert, both of Ariz.; Faivel Pintchovski, Austin, Tex.

[73] Assignee: Motorola, Inc., Schaumburg, Ill.

[21] Appl. No.: 69,648

[22] Filed: Jun. 1, 1993

Related U.S. Application Data

[63] Continuation of Ser. No. 589,354, Sep. 28, 1990, abandoned.

[51] Int. Cl.$^6$ .......................................... H01L 21/265
[52] U.S. Cl. ........................................ 437/41; 437/57; 437/133; 437/912; 437/192; 148/DIG. 53; 148/DIG. 72
[58] Field of Search ............... 437/41, 912, 192, 56, 437/57, 126, 133, 41; 148/DIG. 72, DIG. 53

[56] References Cited

U.S. PATENT DOCUMENTS

| | | | |
|---|---|---|---|
| 4,359,816 | 11/1982 | Abbas et al. | 437/41 |
| 4,378,627 | 4/1983 | Jambotkar | 437/41 |
| 4,472,872 | 9/1984 | Toyoda et al. | 437/912 |
| 4,615,102 | 10/1986 | Suzuki et al. | 437/58 |
| 4,635,343 | 1/1987 | Kuroda | 437/57 |
| 4,729,000 | 3/1988 | Abrokwah | 357/22 |
| 4,822,753 | 4/1989 | Pintchovski et al. | 437/192 |
| 4,830,980 | 5/1989 | Hsieh | 437/56 |
| 4,849,368 | 7/1989 | Yamashita et al. | 437/41 |
| 4,879,254 | 11/1989 | Tsuzuki et al. | 437/41 |
| 4,892,843 | 1/1990 | Schmitz et al. | 437/192 |
| 4,963,511 | 10/1990 | Smith | 437/192 |

FOREIGN PATENT DOCUMENTS

| | | | |
|---|---|---|---|
| 0267730 | 5/1988 | European Pat. Off. | 437/192 |
| 0073377 | 4/1986 | Japan | 437/912 |

OTHER PUBLICATIONS

Tennant et al., "Electron beam fabrication of high performance InGaAs/InAlAs heterojunction insulated gate field effect transistors with submicron refractory airbridge gates", J. Vac. Sci. Technol. B6(6), Nov./Dec. 1988, pp. 1820–1823.

Ruden et al. "High Performance Complementary Logic Based OnGaAs/InGaAs/AlGaAs HIGFETs*", IEDM 1989, pp. 117–119.

Kiehl et al., "Complementary P. and N. Channel Quantum-Well Mi$^3$SFET's", IEDM, 1988, pp. 684–687.

Baek et al., "New Mechanism of Gate Curent in Heterostructure Insulated Gate Field-Effect Transistors", IEEE EDL-7, No. 9 Sep. 1986, pp. 519–521.

Ferer et al., "Gate-Length Dependence of DC and Microwave Properties of Submicrometer $In_{0.53}Ga_{0.47}As$ HIGFET's", IEEE EDL Oct. 2 Feb. 1989, pp. 70–72.

Abrokwah et al., "High-Performance Self-Aligned (Al.Ga) As/(InGa) As Prandomorphic HIGFET's", IEEE EDL Oct. 5, May 1989, pp. 225–226.

(List continued on next page.)

Primary Examiner—Brian E. Hearn
Assistant Examiner—Tuan Nguyen
Attorney, Agent, or Firm—Harry A. Wolin

[57] ABSTRACT

Self-aligned HFETS are fabricated by providing a semi-insulating substrate and forming a low bandgap III-V semiconductor layer thereon. A first dielectric layer of a first dielectric material is formed on the III-V layer and first and second openings are formed through the first dielectric layer and the III-V layer. After forming dielectric spacers of a second dielectric material on the sidewalls of the first and second openings, gates are formed therein. The first dielectric layer is subsequently removed and source and drain regions are formed in the III-V layer and substrate adjacent to each of the gates. The formation of the source and drain regions is self-aligned to the gates. After forming isolation regions between devices, ohmic contacts to the source and drain regions, all being of a like material, are formed. This formation is also self-aligned to the gates.

8 Claims, 1 Drawing Sheet

OTHER PUBLICATIONS

Ruden et al., "Quantum-Well p. Channel AlGaAs/InGaAs/GaAs Heterostructure Insulated-Gate Field-Effect Transistors", IEEE Transactions on Electron Devices, 36/11, Nov. 1989, pp. 2371–2378.

Matsumoto et al., "Complementary GaAs SIS FET Invester Using Selective Crystal Regrowth Technique by MBE", IEEE EDL 7/3, 3/86 pp. 182–184.

Shinichiro Takatani et al., "i-AlGaAs/n-GaAs Doped-channel Heterostructure Insulated Gate FET(-Dc-HIGFET with n+ GaAs selective gram by MDCVD", IEDM, 1988, pp. 692–695.

Birbas et al., "Low Frequency Noise in p-Channel Heterostructure Insulated-Gate Field-Effect Transistors (HIGFET's) at 77k and Drain Current of 1 $\mu$a", IEEE EDL Oct. 7 Jul. 1989, pp. 316–318.

Daniels et al., "Complementary Heterostructure Insulated Gate FET Circuits for High-Speed, Low Power VLSI", IEDM, 1986, pp. 448–451.

Cirillo et al., "Complementary Heterostructure Insulated Gate Field Effect Transistor (HIGFET's)", IEDM, 1985, pp. 317–320.

Mizutani et al., "Circuit Performance of Complementary Heterostructure MisFET inverter using High Mobility 2DEG and 2DHG", IEEE GaAs IC Symposium, 1986, pp. 107–110.

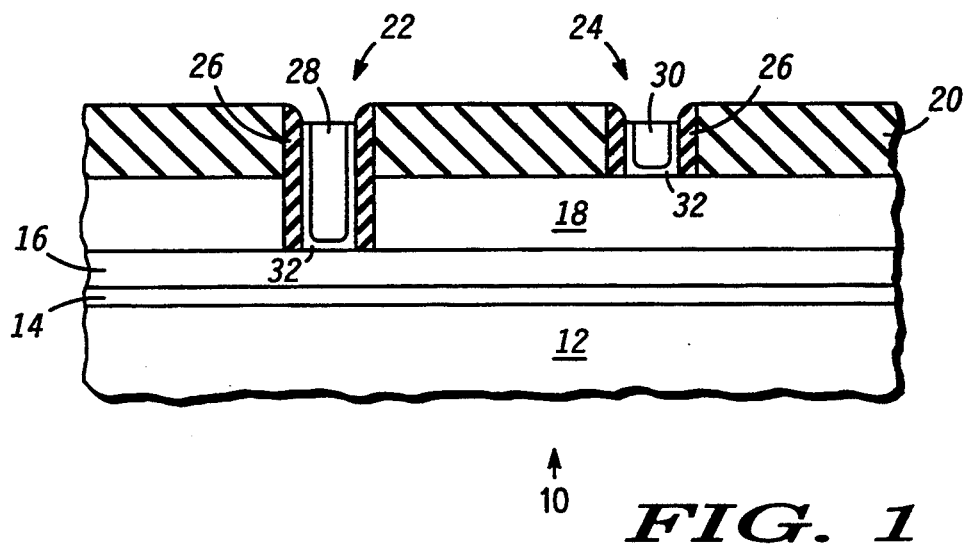
FIG. 1
FIG. 2
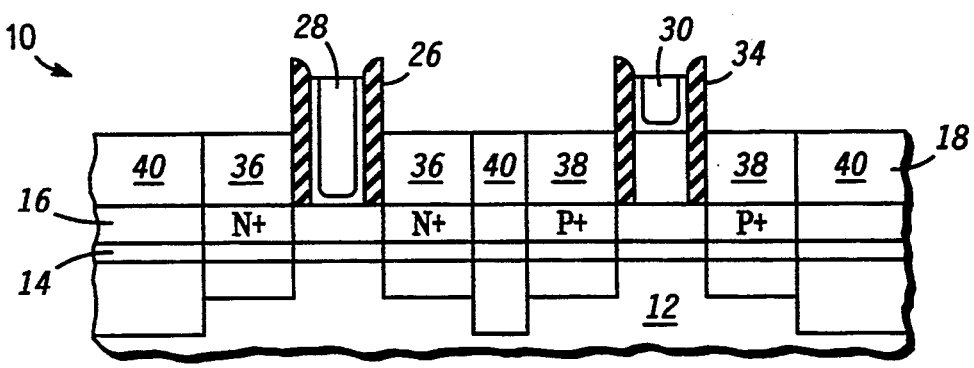
FIG. 3
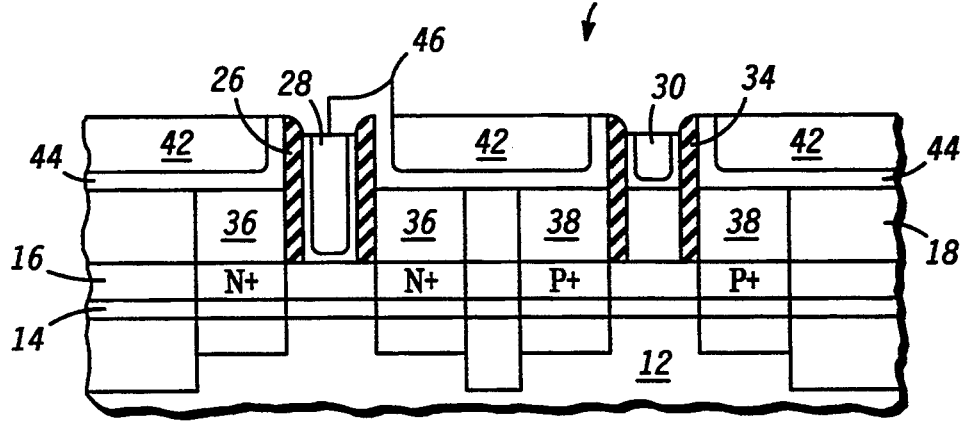

SELF-ALIGNED COMPLEMENTARY HFETS

This application is a continuation of prior application Ser. No. 07/589,345, filed Sep. 28, 1990, now abandoned.

FIELD OF THE INVENTION

This invention relates, in general, to semiconductor devices, and more particularly to self-aligned complementary heterostructure FETs (HFETs) and a method of fabrication thereof.

BACKGROUND OF THE INVENTION

Digital circuits made of III-IV semiconductor FETs and the like have been demonstrated to have superior speed and power performance and are used in applications such as super computers. However, the power consumption of this type of device needs to be improved. Complementary HFETs are known for low power consumption and are expected to provide high speed capabilities. It is therefore beneficial to be able to fabricate Complementary HFETs in an efficient and relatively inexpensive manner.

In their article entitled "Complementary Heterostructure Insulated Gate FET Circuits for High-Speed, Low Power VLSI", IEDM 86, page 448 Daniels et al disclose a well known complementary HIGFET structure. Although this structure is capable of relatively high-speed operation and consumes reduced amounts of power, there are basic problems associated with the fabrication and operation thereof. Although source and drain fabrication is self-aligned to gates, ohmic contact formation is not self-aligned at all. The ohmic contacts further comprise different metals for the P contacts and the N contacts. Finally, no local interconnect is provided so that regions of one device may be coupled with regions of another.

U.S. Pat. No. 4,830,980 entitled "Making Complementary Integrated P-MODFET and N-MODFET" issued to Hsieh on May 16, 1989, discloses a relatively high speed structure. The method for fabricating complementary MODFETS includes implanting a portion of an N channel with P type ions of sufficient dosage to transform the portion into a P channel. Again, different ohmic metals are used for the P contacts and N contacts and the formation of the ohmic contacts is not self-aligned to the gates. Furthers, no local interconnects are provided.

In view of the above, it is highly desirable to have complementary HFETs wherein the fabrication of the sources, drains and ohmic contacts is self-aligned to the gates and local interconnects are provided as part of a multi-level interconnect-system for sub-micron VLSICs and ULSICs. This technology allows for further improvements in density, speed and power consumption.

SUMMARY OF THE INVENTION

A method of fabricating HFETs includes providing a semi-insulating substrate and forming a low bandgap III-V semiconductor layer thereon. Following the formation of a first dielectric layer of a first dielectric material on the III-V layer, first and second opening extending through the first dielectric layer and the III-V layer are formed. Dielectric spacers of a second dielectric material are formed on the sidewalls of the first and second openings followed by the formation of gates in the first and second openings. After removing the first dielectric layer, source and drain regions are formed adjacent to the first and second gates. This formation is self-aligned to the gates. Isolation regions are formed between devices and ohmic contacts to the source and drain regions are then formed. The ohmic contact formation is also self-aligned to the gates.

BRIEF DESCRIPTION OF THE DRAWINGS

FIGS. 1-2 are highly enlarged cross-sectional views of a portion of a complementary HFET structure during fabrication in accordance with the present invention; and FIG. 3 is a highly enlarged cross-sectional view of a portion of a complementary HFET structure in accordance with the present invention.

DETAILED DESCRIPTION OF THE DRAWINGS

FIGS. 1-2 are highly enlarged cross-sectional views of a portion of a complementary HFET structure 10 during fabrication in accordance with the present invention.

Now referring specifically to FIG. 1. A semi-insulating substrate 12 comprises gallium arsenide (GaAs) herein although it may comprise one of many III-V semiconductors. Substrate 12 preferably includes a buffer layer comprising epitaxial GaAs which is approximately 0.5 microns thick. If desired, the buffer layer may be pulse doped during its growth. For example, P type pulse doping of the buffer layer with beryllium will adjust the threshold voltage of the P type devices. If the buffer layer is pulse doped, a second GaAs epitaxial layer is grown on the pulse doped buffer layer.

A channel layer 14 is formed on substrate 12. In this embodiment, channel layer 14 comprises indium gallium arsenide ($In_xGa_{1-x}As$) and is on the order of 150 angstroms thick. Channel layer 14 may or may not be doped. This is application specific and depends on desired device characteristics such as threshold voltage. An aluminum gallium arsenide ($Al_xGa_{1-x}As$) layer 16 is formed on channel layer 14. AlGaAs layer 16 preferably has a thickness of approximately 250 angstroms. It should be understood that the In and Ga composition of channel layer 14 and the Al and Ga composition of layer 16 may be varied to obtain desired device characteristics.

A low bandgap layer 18 is formed on AlGaAs layer 16 and comprises a relatively low bandgap material. In this embodiment, low bandgap layer 18 comprises a GaAs layer having an $In_xGa_{1-x}As$ layer disposed thereon. The GaAs layer is approximately 200 Angstroms thick and has an N+ conductivity type. The $In_xGa_{1-x}As$ layer is approximately 500 Angstroms thick, has an N+ conductivity type and x is graded from 0 to 0.53. It should be understood that x may be graded as high as 1.0. Although specific low bandgap materials are recited for low bandgap layer 18, it should be understood that other materials having a bandgap of approximately 1.4 electron volts or less such as germanium (Ge) may also be employed.

A first dielectric layers 20 of a first dielectric material, either oxide or nitride, is formed on low bandgap layer 18. A first opening 22 is then formed through first dielectric layer 20 and low bandgap layer 18. A second opening 24 is formed through first dielectric layer 20. First opening 22 and second opening 24 are formed by methods well known in the art. It should be understood that it is also possible for second opening 24 to extend through low bandgap layer 18.

Following the formation of first opening 22 and second opening 24, a second dielectric layer (not shown) of a second dielectric material is formed over the entire surface of structure 10. The second dielectric material may also be either oxide or nitride but must be different than the first dielectric material so differential etches and the like may later be employed. The second dielectric layer is etched by a well known method such as reactive ion etching to form sidewall spacers 26 in first opening 22 and second opening 24.

Following the formation of sidewall spacers 26, a first gate 28 and a second gate 30 are formed. Gates 28 and 30 comprise tungsten (W) herein but may also comprise other materials such as tungsten nitride (WN). The formation of W gates 28 and 30 may be by selective W deposition or blanket W CVD. As depicted herein, blanket W CVD formation is used. This includes forming an intermediate layer 32 over the entire surface of structure 10. It is important that intermediate layer 32 adhere to both the surface of structure 10 and to W. Intermediate layer 32 may comprise titanium nitride (TiN), titanium tungsten nitride (TiWN) or titanium tungsten (TiW). Following the formation of intermediate layer 32, a blanket W layer is formed thereon which will readily adhere to intermediate layer 32.

The blanket W layer and intermediate layer 32 are etched back to form W gates 28 and 30 in openings 22 and 24 respectively. First dielectric layer 20 is a good endpoint for this etch. The endpoint may be detected by monitoring wavelength because plasma etching first dielectric layer 20 will emit a different wavelength than will W or the material of intermediate layer 32.

Now referring specifically to FIG. 2. Following the formation of first W gate 28 and second W gate 30, sidewall spacers 26 disposed in second opening 24 are removed. Sidewall spacers 26 are removed using a selective etch that will not appreciably etch away first dielectric layer 20 or second W gate 30. Once spacers 26 are removed from second opening 24, the portions of low bandgap layer 18 disposed beneath the area where sidewall spacers 26 were formerly disposed are also etched away. Again, a selective etch is used. Once the portions of low bandgap layer 18 have been removed, the openings left by the portions of low bandgap layer 18 and sidewall spacers 26 are refilled with the second dielectric material to form sidewall spacers 34. It should be understood that sidewall spacers 34 will be of approximately the same depth as spacers 26.

Once spacers 34 have been formed, first dielectric layer 20 is etched away. It is important to use a selective etch so that sidewall spacers 26 and 34 formed of the second dielectric material remain. These etches are well known. A pre-implant cap (not shown) is then formed over the entire surface of structure 10. The pre-implant cap is comprised of the first dielectric material in this embodiment. It should be understood that the pre-implant cap may alternatively be fabricated by only removing a portion of first dielectric layer 20.

Once the pre-implant cap is in position and the necessary photolithography steps have been performed, first source and drain regions 36 are implanted into low bandgap layer 18, AlGaAs layer 16, channel layer 14 and substrate 12. First source and drain regions 36 are of an N+ conductivity type and are formed by implanting a dopant such as silicon adjacent to first W gate 28. It should be understood that the formation of first source and drain regions 36 is self-aligned to first W gate 28. Following the formation of first source and drain regions 36 and the necessary photolithography steps, second source and drain regions 38 are formed. Second source and drain regions 38 also extend through low bandgap layer 18, AlGaAs layer 16, channel layer 14 and into substrate 12. Second source and drain regions 38 are of a P+ conductivity type and are formed by implanting a dopant such as beryllium adjacent to second W gate 30. The formation of second source and drain regions 38 is self-aligned to second W gate 30.

Once first source and drain regions 36 and second source and drain regions 38 have been formed, structure 10 is subjected to an implant anneal as is well known in the art. Following the anneal, isolation regions 40 are formed in structure 10 between devices to isolate them from each other. Isolation regions 40 may be formed by implanting impurities between devices or by etching and refilling as is known in the art. In this embodiment, isolation regions 40 are formed by implanting oxygen. Isolation regions 40 extend into low band gap layer 18, AlGaAs layer 16, channel layer 14 and into substrate 12 even deeper than source and drain regions 36 and 38.

Once isolation regions 40 have been implanted, the pre-implant cap is removed. The devices may now be further isolated from each other by forming nitride or other similar regions (not shown) on the surface of low bandgap layer 18 above isolation regions 40. The use of these regions is application specific and cannot be employed if certain local interconnects (to be explained presently) are to be used.

FIG. 3 is a highly enlarged cross-sectional view of a portion of complementary HFET structure 10 in accordance with the present invention. Ohmic contacts 42 contacting source and drain regions 36 and 38 are formed on the surface of structure 10. Ohmic contacts 42 comprise W in this embodiment although they may comprise other contact materials such as Al. The formation of W ohmic contacts 42 may be by selective W CVD or blanket W CVD. FIG. 3 depicts blanket W CVD formation which is performed in basically the same manner as the formation of first and second W gates 28 and 30. Initially, an ohmic contact intermediate layer 44 is formed on the surface of structure 10. Again, this layer must adhere to both the surface of structure 10 and to W. Ohmic contact intermediate layer 44 may comprise TiN, TiWN or TiW. Following the formation of ohmic contact intermediate layer 44, a blanket W layer is deposited thereon and etched back accordingly to form ohmic contacts 42. It should be understood that the formation of ohmic contacts 42 is self-aligned to first gate 28 and second gate 30.

Following the formation of ohmic contacts 42, structure 10 is annealed to stabilize oxygen implanted isolation regions 40 and ohmic contacts 42. An anneal of approximately 10 seconds at a temperature of approximately 600 degrees centigrade is sufficient.

Ohmic contact intermediate layer 44 may be exposed above first gate 28 and second gate 30 after etching the blanket W layer to form ohmic contacts 42. This may be done by using ohmic contact intermediate layer 44 as the endpoint for the blanket W etch. The wavelength generated during plasma etching titanium (Ti) in ohmic contact intermediate layer 44 could be monitored to detect this endpoint. The exposed portions of ohmic contact intermediate layer 44 could then be patterned to form local interconnect 46. As depicted herein, local interconnect 46 couples first gate 28 to region 38. It should be understood that ohmic contact intermediate layer 44 may be patterned in various other ways to form local interconnects coupling other regions of transistors. This type of local interconnect coupling may occur between gates of separate transistors as well as between gates and ohmic contacts of the same or different transistors.

If selective W deposition is employed to form ohmic contacts 42, there would be no ohmic contact intermediate layer needed. In such case, local interconnects could be formed by depositing a platinum (Pt) layer on the surface of structure 10 and forming a silicon (Si) layer on the Pt layer. Portions of the Si layer where local interconnects are not desired would be removed. After removal of the unwanted Si, a heat treatment would be used to initiate silicidation to form platinum silicide (PtSi). The unreacted Pt would then be etched away to leave a PtSi local interconnect to couple regions of the same or separate transistors. It should be understood that local interconnects may also be formed by depositing and patterning other metals such as Al or aluminum copper (AlCu).

The present invention is compatible with multi-level metallization schemes commonly used with silicon technology because the resultant surface of structure 10 has no III-V semiconductor material thereon. All of the exposed surface of structure 10 is compatible with standard silicon interconnect processes.

Complementary HFET structure 10 is very high speed and consumes reduced amounts of power. Moreover, the fabrication process of structure 10 is excellent in that all ohmic metal is self-aligned to the gates and is of the same material. Further, local interconnects may be built into the structure and used as portions of first level metal in a multi-level metallization scheme.

Thus it is apparent that there has been provided a self-aligned complementary HFET structure and method of fabrication. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

We claim:

1. A method of fabricating HFETs comprising the steps of:
   providing a semi-insulating substrate;
   forming a low bandgap III-V semiconductor layer on said substrate;
   forming a first dielectric layer of a first dielectric material on said III-V layer;
   forming first and second openings extending through said first dielectric layer and said III-V layer;
   forming dielectric spacers of a second dielectric material on the sidewalls of said first and second openings;
   forming gates in said first and second openings;
   removing said first dielectric layer;
   forming source and drain regions in said III-V layer and said substrate adjacent to each of said gates, the formation being self-aligned to said gates;
   forming isolation regions between devices; and
   forming ohmic contacts, all of a like material, to said source and drain regions, the formation being self-aligned to said gates.

2. The method of claim 1, wherein the forming gates steps includes forming W gates by one of selective W deposition into the first and second openings and forming an intermediate layer on the surface of the HFETs, forming a blanket W layer on said intermediate layer and etching back said W and intermediate layers so that they are disposed only in said first and second openings.

3. The method of claim 2 wherein the intermediate layer comprises one of TiN, TiWN and TiW.

4. The method of claim 1 wherein the forming source and drain regions step includes forming a source region and a drain region of a first conductivity type adjacent to the gate formed in the first opening and forming a source region and a drain region of a second conductivity type adjacent to the gate formed in the second opening.

5. The method of claim 1 wherein isolating structures are formed on the III-V layer above the isolation regions prior to the forming ohmic contacts step.

6. The method of claim 1 wherein the forming ohmic contacts step includes forming W ohmic contacts by one of selective W deposition and forming an ohmic contact intermediate layer on the surface of the HFETs, forming a blanket W layer on said ohmic contact intermediate layer and etching back said W layer and said ohmic contact intermediate layer.

7. The method of claim 6 wherein the ohmic contact intermediate layer comprises one of TiN, TiWN and TiW.

8. The method of claim 7 wherein the ohmic contact intermediate layer is patterned and used as local interconnect between one of devices and regions of the same device.

* * * * *